United States Patent [19]

Szluk et al.

[11] Patent Number: 4,679,299
[45] Date of Patent: Jul. 14, 1987

[54] FORMATION OF SELF-ALIGNED STACKED CMOS STRUCTURES BY LIFT-OFF

[75] Inventors: Nicholas J. Szluk, Albuquerque, N. Mex.; Gayle W. Miller, Colorado Springs, Colo.

[73] Assignee: NCR Corporation, Dayton, Ohio

[21] Appl. No.: 895,407

[22] Filed: Aug. 11, 1986

[51] Int. Cl.[4] .................... H01L 29/78; H01L 29/04; H01L 27/02
[52] U.S. Cl. .................................. 29/571; 29/576 B; 29/576 J; 29/578; 148/1.5; 148/187; 148/DIG. 164; 357/23.7; 357/41; 357/45; 357/59; 357/91
[58] Field of Search ................ 29/571, 576 B, 576 J, 29/578; 148/187, 1.5; 357/23.7, 41, 45, 59, 91; 156/657, 643, 653

[56] References Cited

U.S. PATENT DOCUMENTS

| | | | |
|---|---|---|---|
| 4,476,475 | 10/1984 | Naem et al. | 357/23.7 |
| 4,479,297 | 10/1984 | Mizutani et al. | 29/571 |
| 4,498,226 | 2/1985 | Inoue et al. | 29/576 B |
| 4,555,721 | 11/1985 | Bansal et al. | 357/42 |
| 4,603,341 | 7/1986 | Bertin et al. | 357/23.7 |
| 4,630,089 | 12/1986 | Sasaki et al. | 357/23.7 |
| 4,633,438 | 12/1986 | Kume et al. | 365/51 |
| 4,654,121 | 3/1987 | Miller et al. | 156/653 |

FOREIGN PATENT DOCUMENTS

| | | | |
|---|---|---|---|
| 0199231 | 7/1982 | Japan | 29/576 W |
| 0204135 | 12/1982 | Japan | 29/576 R |
| 0127330 | 7/1983 | Japan | 156/657 |
| 0086241 | 5/1984 | Japan | 29/576 R |
| 0021553 | 2/1985 | Japan | 357/59 E |

OTHER PUBLICATIONS

Colinge et al. "St-CMOS : A Double-Poly-NMOS-. . ." IEDM (81), pp. 557-560, 7/1981.
Hoefflinger et al., "A Three Dimensional-CMOS Design Methodology", Custom Integrated Circuits Conference, Rochester, N.Y. May-pp. 76-78, 23-25, 1983.
Liu et al., "Design Aspects of Three-Dimensional CMOS . . ." UGIM Symposium, May 25-27, 1983, Texas A & M Texas pp. 76-78.

Primary Examiner—Brian E. Hearn
Assistant Examiner—William Bunch
Attorney, Agent, or Firm—Wilbert Hawk, Jr.; Casimer K. Salys

[57] ABSTRACT

A process for fabricating a self-aligned three-dimensionally integrated circuit structure having two channel regions responsive to a common gate electrode. A relatively thick lift-off region is formed over and in alignment with the gate electrode. A thick oxide layer is then deposited over the structure so as to form stressed oxide extending from the lift-off layer sidewalls. A selective etch of the stressed oxide follows. The relatively thick oxide covering the lift-off layer is then removed with the etch of the lift-off layer, the lift-off etch acting through the exposed lift-off layer sidewalls. The formation of an upper field effect transistor gate oxide and a conformal deposition of polysilicon for the channel and source/drain regions follows. The conformally deposited polysilicon retains the contour of the recess formed by the lift-off. The gate aligned recess is then filled with a dopant masking material by deposition and etching, which dopant masking material thereafter defines during implant or diffusion an upper field effect transistor channel region self-aligned with the common gate electrode. The characteristics of the upper field effect transistor can be improved by applying laser recrystallization techniques.

18 Claims, 9 Drawing Figures

4,679,299

FORMATION OF SELF-ALIGNED STACKED CMOS STRUCTURES BY LIFT-OFF

BRIEF SUMMARY

The present invention is directed to a process for fabricating integrated circuit electronic devices, and is particularly directed to those techniques by which field effect transistors can be fabricated in a stacked configuration, often referred to as three dimensional integration, wherein the gate electrode is common to a vertically coincident pair of channel regions.

According to one practice of the invention, both the underlying and the overlying field effect devices are upon fabrication self-aligned to the gate electrode, in a configuration which has minimum Miller capacitance and exhibits a substantially planar concluding surface topography. The process utilizes the preferential etch rate of stressed silicon dioxide (oxide) in combination with a gate aligned lift-off technique to first define a gate aligned topographical recess, and then by conformal polysilicon (poly) deposition and maskant material planarization steps to provide gate aligned upper field effect transistor channel, source and drain regions.

According to a preferred practice of the invention, an active region is defined in conventional manner and patterned to have a doped polysilicon gate electrode covered by a relatively thick, coextensive silicon nitride (nitride) layer, together defining an underlying field effect transistor channel region between source/drain regions. A chemical vapor deposited (CVD) oxide layer materially thicker than the gate polysilicon is then formed over the structure. The deposition is performed so that the oxide formed over the vertically projecting regions is selectively stressed in relative relation to the slope. A selective etch of the stressed oxide follows, using an etchant which preferentially removes stressed silicon dioxide over unstressed silicon dioxide. The gate-aligned nitride sidewall exposed by the selective removal of stressed oxide is then subjected to nitride selective solvents to remove the nitride and lift-off the CVD oxide layer region directly overlying the polysilicon gate electrode.

The upper surface of the polysilicon gate electrode so exposed is oxidized or covered by a deposited upper gate oxide layer to form an upper gate dielectric. A second, undoped polysilicon layer is then conformally deposited over the structure, which upper polysilicon follows the contour of the recess formed by the lift-off removal of the nitride and overlying CVD oxide layers. The deposition of a relatively thick planarizing oxide layer, and a planarizing etch of the oxide and second polysilicon layers to the level of the polysilicon outside the gate electrode aligned recess produces a structure in which the planarizing oxide remains solely in the gate electrode aligned recess. Ion implantation or diffusion of dopant follows, to selectively dope the second polysilicon layer in the presence of the recess retained planarizing oxide region, which now serves as a self-aligned mask for the doping of the source/drain regions of the field effect device formed from the second polysilicon layer.

The single gate electrode of the stacked structure formed by such operations is self-aligned to both the upper and lower field effect transistor channel regions. Both transistors exhibit minimum Miller capacitance and minimum capacitive coupling between the respective source/drain regions of the stacked devices. Furthermore, the concluding structure has a substantially planar topography, easing the step coverage problems associated with subsequent fabrication operations. These and other beneficial features of the presently disclosed process will be more fully understood upon considering the detail description which follows.

DETAILED DESCRIPTION

The continuing pursuit of greater densities for integrated circuit semiconductors has in recent times led to the consideration of three dimensional integration, most commonly arising in the context of stacked CMOS field effect devices. Though numerous techniques have been proposed, the prevailing approaches suffer from a number of common deficiencies.

For example, substantially all known techniques lack full self-alignment between the upper field effect transistor and the gate electrode, leading to significant magnitudes of Miller capacitance with degraded high frequency performance. Other techniques are even unable to utilize a common gate electrode.

A further commonly encountered deficiency is the creation of a three dimensional structure with a dramatically nonplanar topography, requiring significant planarization and leading to greater difficulties in making contacts through the thick dielectrics used in such planarizations. Furthermore, such known processes commonly create stacked CMOS structures in which the source/drain regions of the lower field effect transistor are, by virtue of the thin intermediate dielectric, materially coupled to the source/drain regions of the upper field effect transistor, again leading to constraints on high frequency performance.

From the perspective of manufacturability, such representative techniques require precise alignments between the mask used to form the lower device and that used to form the upper device. No less detrimental are those implementations which require critical etching operations, including elaborate end point detection equipment, during fabrication.

The process according to the present invention provides a technique by which three dimensional integration, and in particular a stack CMOS structure, can be practiced to create a pair of self-aligned field transistors, which utilize a common gate electrode, which exhibit minimum source/drain coupling between the stack devices, and which provide a relatively planar concluding surface topography.

Figure 1:
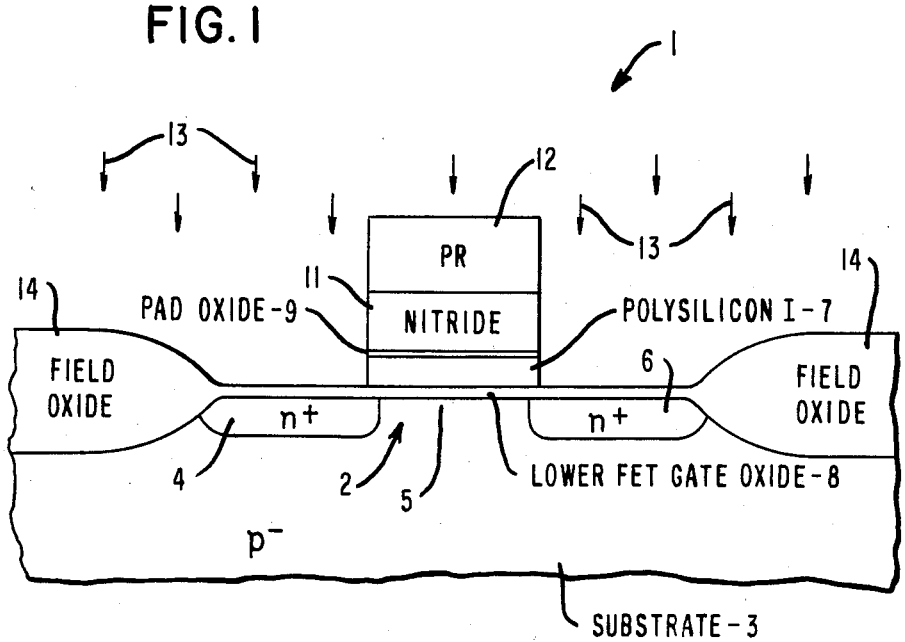
FIG. 1 is a schematic cross-section of the device structure following the formation of the gate electrode lift-off structure and formation of the lower transistor source/drain regions.

Attention is now directed to FIG. 1 of the drawings, where the effects of initial fabrication are schematically depicted. The embodiment is selected to illustrate the fabrication of a stacked CMOS structure at 1. The lower level field effect transistor 2 is an n-channel device situated in p-doped monocrystalline silicon substrate 3, shown as configured to have n+doped source/drain regions 4 and 6 self-aligned with a first, conductively doped, polycrystalline silicon layer gate electrode 7. Gate electrode 7 is separated from channel 5 of field effect transistor 2 by gate dielectric 8 of oxide. The self-alignment noted earlier between gate electrode 7 and source/drain regions 4 and 6 is attributable to the masking effects of the stacked structure composed of gate electrode 7, PAD oxide layer 9, lift-off nitride layer 11 and photoresist (PR) layer 12. Source/drain formation is accomplished using conventional phosphorus or arsenic implant 13. Note that for the present embodiment, the field effect transistor 2 is separated from other regions of substrate 3 by conventionally formed, semirecessed field oxide regions 14.

To reach the stage of fabrication depicted in FIG. 1, the active region at 1 between field oxides 14 is processed to cover substrate 3 with a gate oxide layer 8 of approximately 50 nanometers, preferably by thermal oxidation of substrate 3. Thereafter, a first polysilicon layer is chemical vapor deposited to a thickness of approximately 500 nanometers. The first polysilicon layer can be conductively doped in situ or by blanket implant or diffusion following deposition. First polysilicon layer 7 is then oxidized to form a thin PAD oxide layer 9 of approximately 20 nanometers. The PAD oxide layer serves as a stress buffer between the subsequently deposited nitride layer 11 and the polysilicon layer 7.

Following the formation of PAD oxide layer 9, a relatively thick nitride layer 11 is formed over the structure, the nitride layer preferably being plasma enhanced chemical vapor deposited to a nominal thickness of approximately 500 nanometers using $S_iH_4$ and $NH_3$ gases, in a chamber having a temperature of approximately 350° C. and a pressure of approximately 1.5 Torr, for a period of approximately 45 minutes. The relatively thick lift-off layer 11 could be comprised of aluminum, with appropriate nominal refinements in the subsequent processing steps to utilize the differences in the materials while retaining the fundamental process characteristics.

Following the deposition of nitride layer 11, a photoresist is deposited and photolithographically patterned in relatively convention manner to retain a segment 12. In the presence of pattern photoresist 12, the nitride, PAD oxide and polysilicon layers are anisotropically etched in succession, for example, using first a $SF_6+O_2$ or $NF_3$ for the patterning of the nitride layer 11, a brief etch using freon 116 for patterning PAD oxide layer 9, and an etch with $SF_6+O_2$ or $Cl_2$ to coextensively defining polysilicon layer 7. In the event aluminum is used in place of the nitride, a suitable aluminum selective etchant would be the first utilized. Thereafter, the remaining elements depicted in FIG. 1, namely, the self-aligned source/drain regions 4 and 6, are created by implant 13. For purposes of illustration, the implant could entail the use of arsenic ions implanted with an energy of 80 KeV, and a dose of SE15 ions per square centimeter. The elemental structure depicted in FIG. 1 is thereby created.

Figure 2:
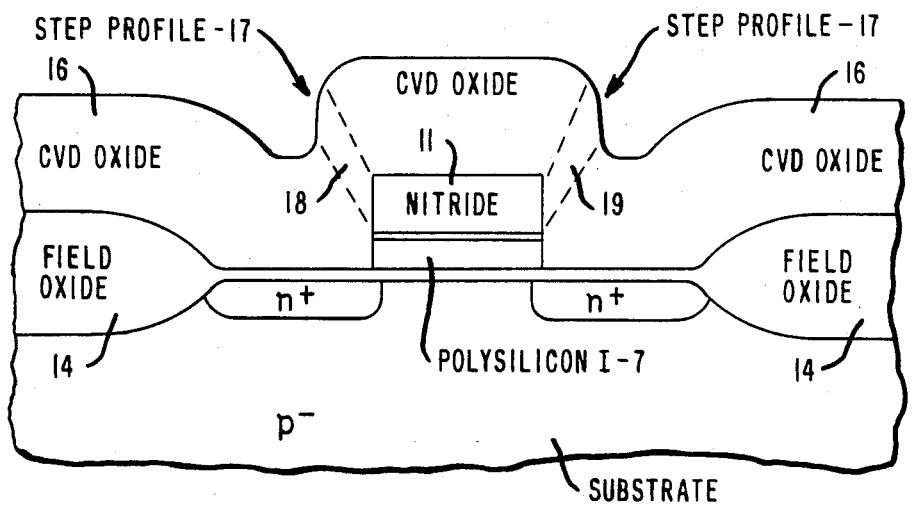
FIG. 2 is a schematic cross-section following the deposition of the CVD oxide layer.

The fabrication process to which this invention pertains is continued as depicted in FIG. 2 the drawings by the formation of a plasma enhanced chemical vapor deposited oxide layer over the structure in FIG. 1 following the strip removal of patterned photoresist 12. For the exemplary polysilicon 7 and nitride 11 thicknesses specified earlier, CVD oxide 16 is preferably deposited to a nominal thickness of approximately 650 nanometers, the conditions and dimensions being selected to accentuate the formation of a stepped profile 17 with attendant stressed oxide regions 18 and 19 extending from the vertically oriented walls of nitride layer 11. The deposition of CVD oxide layer 16 is preferably done using $S_iH_4$, $N_2O$ and $O_2$ gases in a chamber at a temperature of approximately 380° C. and a pressure of approximately 1.1 Torr for approximately 20 minutes.

Fabrication then continues following the lift-off concepts described in U.S. Pat. Nos. 4,407,851 and 4,448,800, to the extent of selectively removing stress CVD oxide regions 18 and 19. For instance, it is possible to use the preferential etch characteristics of diluted hydrofluoric acid (HF) to remove stressed CVD oxides 18 and 19 as depicted in FIG. 2 to create the structure depicted in FIG. 3. Note that the thickness and sidewall slope of nitride layer 11 concentrates the stress oxide to either side of the nitride, in such a way that the CVD oxide which remains over source/drain regions 4 and 6 is unstressed and relatively thick. Thereby, step profile 17 is aligned with nitride layer 11, which layer 11 is itself aligned with polysilicon gate electrode 7.

A lift-off of CVD oxide segment 21 follows, using a nitride selective isotropic etchant. For the described structure, this lift-off can be performed by using boiling phosphoric acid for a period of approximately 60 minutes. Openings 22 and 23, created upon the removal of the stress oxide 18 and 19, expose nitride layer 11 to the nitride solvent, and in so doing results in a lift-off of CVD oxide segment 21. PAD oxide layer 9 masks polysilicon layer 7 from the nitride solvent used during the lift-off operation. Thin PAD oxide layer 9 is thereafter stripped using 50:1 diluted HF to exposed polysilicon I gate electrode 7.

Figure 4:
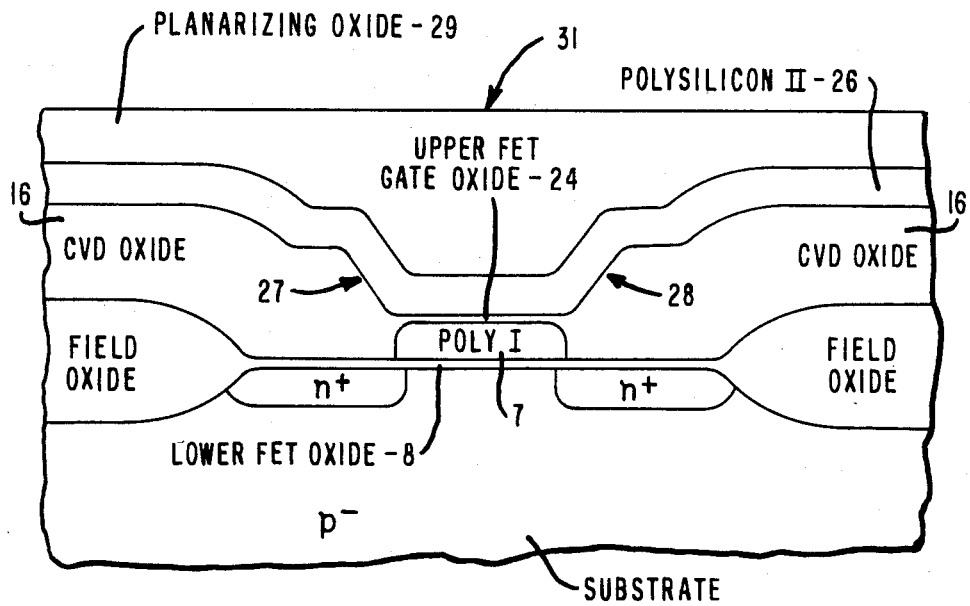
FIG. 4 is a schematic cross-section following the lift-off of the CVD oxide region overlying the gate electrode and the deposition of a conformal polysilicon layer and planarizing oxide layer.

Following the lift-off and gate electrode exposure operations, the structure is preferably subjected to an oxidation operation which forms an upper field effect transistor gate oxide layer 24, in FIG. 4, to a nominal thickness of 50 nanometers. Preferably, this is performed by subjecting the substrate to an oxidizing ambient composed of dry $O_2$, at a temperature of approximately 950° C., and at atmospheric pressure for a period of approximately 50 minutes. Following such oxidation, the upper surface of polysilicon layer 7 is enclosed within a gate oxide or other dielectric. It is also possible to form the upper field effect transistor gate oxide 24 by chemical vapor deposition and thereby prevent outdiffusion of dopant from polysilicon gate electrode 7.

With the upper gate oxide 24 in place, a second polycrystalline silicon layer 26 is conformally deposited, to a nominal thickness of 300 nanometers. Preferably the second polysilicon layer formation employs a CVD deposition using $S_uH_4$ at a temperature of approximately 650° C., a pressure of approximately 0.3 Torr, and for a period of approximately 30 minutes, to form the intrinsic, undoped polysilicon layer 26. At this point is worth noting that the conformal nature of the second polysilicon layer 26 ensures a continuity in the alignment between polysilicon gate electrode 7 and the subsequently formed upper field effect transistor channel by virtue of the self-alignment of the recess defined by tapered walls 27 and 28 in CVD oxide 16.

The formation of a polysilicon II layer 26 is followed in order with the formation of a planarizing layer of oxide, deposited individually or in combination with an overlying planarizing polymer, to form upon the conclusion of a planarizing etch a substantially planar surface. The selection of oxide over other planarizing and dopant masking materials is discretionary. However, for present purposes, an oxide is both an effective dopant implant barrier and a well characterized planarizing material.

Preferably, planarization to form surface 31 begins when CVD oxide planarizing oxide layer 29 is deposited to a nominal thickness of 300 nanometers, and is followed by the application of a spin-on polymer of photoresist deposited to a nominal thickness of 1000 nanometers, and an etch of the two using known 1:1 etching techniques, to produce substantially planar surface 31. Thereafter, etching is continued using a plasma etch composition of $CHF_3$ and $C_2F_6$, then $SF_6$ and $O_2$, to remove planarizing oxide 29 and polysilicon II 26 materials at substantial equal rates, until the upper surface of the CVD oxide 16 is exposed. The concluding structure is depicted in FIG. 5, where there is shown the CVD oxide 16, a masking residual 30 of planarizing oxide 29 in the recess first defined by walls 27 and 28 of oxide 16, and a layer of undoped polysilicon II layer 26 patterned symmetrically about the recess and gate electrode 7.

Figure 5:
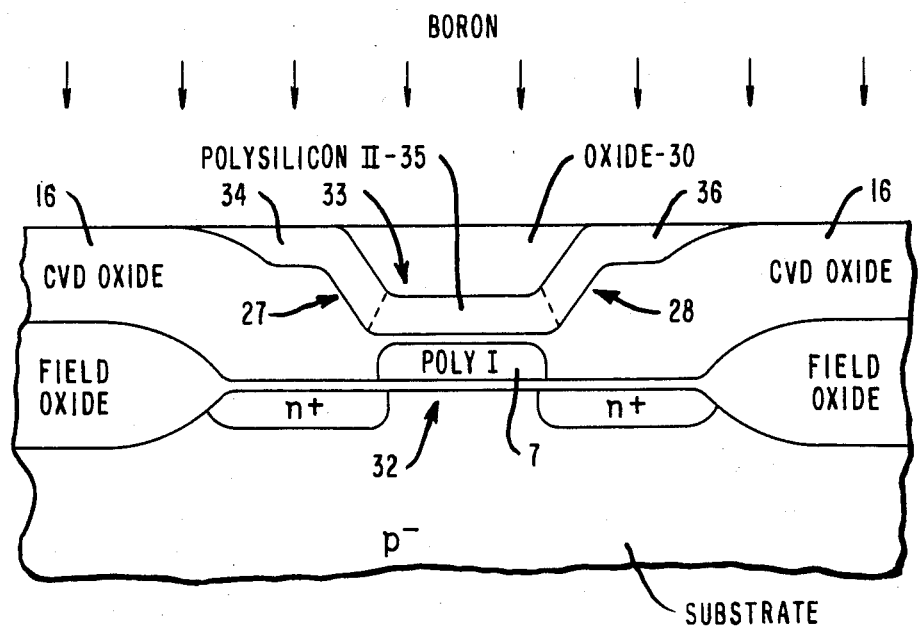
FIG. 5 is a schematic cross-section of the structure following a planarizing etch and the masked source/drain implant to form the upper field effect transistor.

The patterned structure in FIG. 5 shows as one might now appreciate, a self-aligned arrangement of a lower n-channel field effect transistor at 32, aligned therewith a polysilicon gate electrode 7, further structurally aligned therewith a recess 27-28 within which is situated an undoped polysilicon II layer, and finally in alignment with all the preceding a masking oxide layer 30. The structural arrangement in FIG. 5 is then subjected to selective doping of the polysilicon II layer to form the source/drain regions 34 and 36 of upper field effect transistor 33. This operation is preferably performed using a boron ion implant provided at an energy of approximately 30 KeV and at a dose of 2.5E15 ions per square centimeter. The mask formed by the residual oxide 30 ensures that the boron implant dopes the source/drain regions 34 and 36 in alignment with gate electrode 7, while retaining the intrinsic or very lightly doped character of polysilicon II in the channel region 35 directly above gate electrode 7. Thereby, there is formed an upper field effect transistor structure 33 having source/drain regions 34 and 36, and channel 35, self-aligned with gate electrode 7.

Depending on the quality desired of the upper p-channel field effect transistor 33 formed from the structure in FIG. 5, the substrate may be merely annealed at a nominal temperature of 900° C. for a period of approximately 15 minutes to remove implant induced defects in the source/drain regions, or can be subjected to a self-recrystallization, e.g. using laser energy, which recrystallization of regions 34, 35 and 36 would also serve to anneal the boron doped source/drain regions. An upper field effect transistor 33 formed from single crystal, recrystallized, silicon will exhibit better leakage and gain characteristics than its annealed polysilicon II counterpart. Since an anneal or recrystallization will also cause boron diffusion, care must be exercised to avoid excess diffusion to the extent of causing an undue overlap of the upper transistor source/drain regions, 38 and 47 in FIG. 6, with gate electrode 7.

Figure 6:
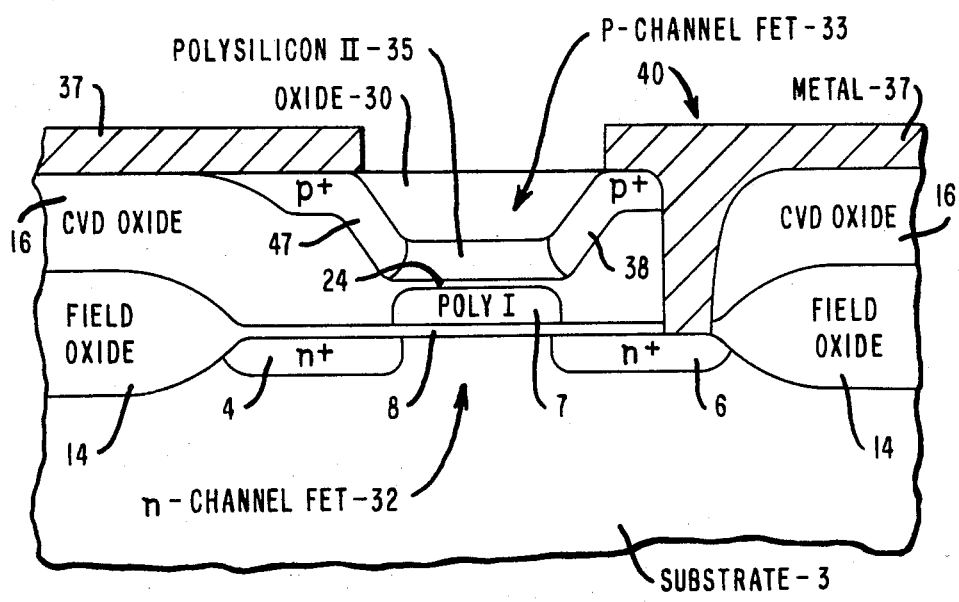
FIG. 6 is a schematic cross-section of the completed embodiment, including the stack CMOS transistor structure and interconnect metallization.

Following the implementation of a recrystallization cycle and metallization, one is left with the three dimensionally integrated structure depicted in FIG. 6. As shown, polysilicon I gate electrode 7 is used to control an n-channel FET 32 and a p-channel FET 33, the channels of both FETs being self-aligned to shared gate electrode 7. Further, as to the structure created, note that the CVD oxide separating the source/drain regions of the p-channel FET 33 and n-channel FET 32 is relatively thick, and as such, minimizes capacitive coupling between the n and p-channel source/drain regions. Also note that the concluding structure is relatively planar, facilitating the formation of metal contacts, such as at 40, and multiple metal interconnect layers 37.

Figure 7:
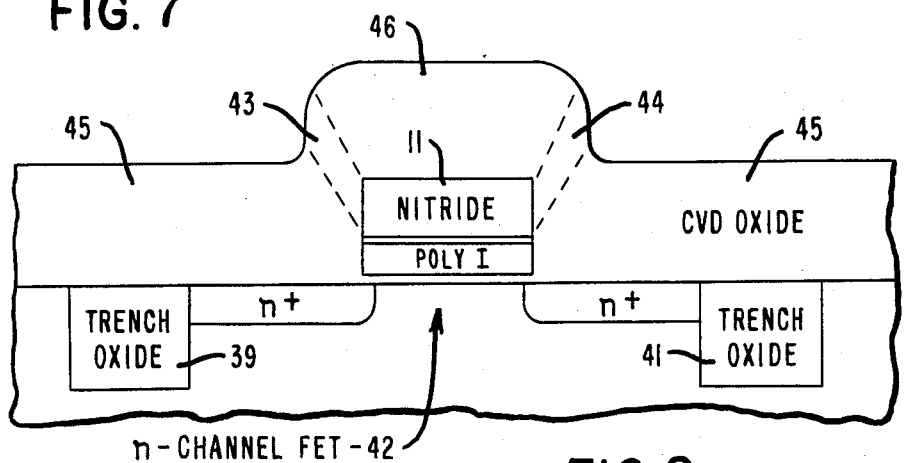
FIG. 7 is a schematic cross-section of the FIG. 2 structure fabricated with trench oxide isolation.

Attention is now directed to FIG. 7 of the drawings, where there is shown schematically in cross section an integrated circuit structure analogous to that previously depicted in FIG. 2, but fabricated with trench dielectric isolation techniques. In particular, note the presence of oxide filled trenches 39 and 41 defining the active region within which n-channel FET 42 is situated. This is in contrast to the semi-recessed structure of field oxides 14 as depicted in FIG. 2. Note the presence of stressed oxide regions 43 and 44, of CVD oxide layer 45, projecting from the vertical profile of relatively thick lift-off nitride layer 11, which stressed oxides are conducive to selective etching in the manner formerly described to expose the sidewalls of nitride 11 and thereby facilitate a removal of elevated CVD oxide 46 with the selective etch of nitride 11.

Figure 3:
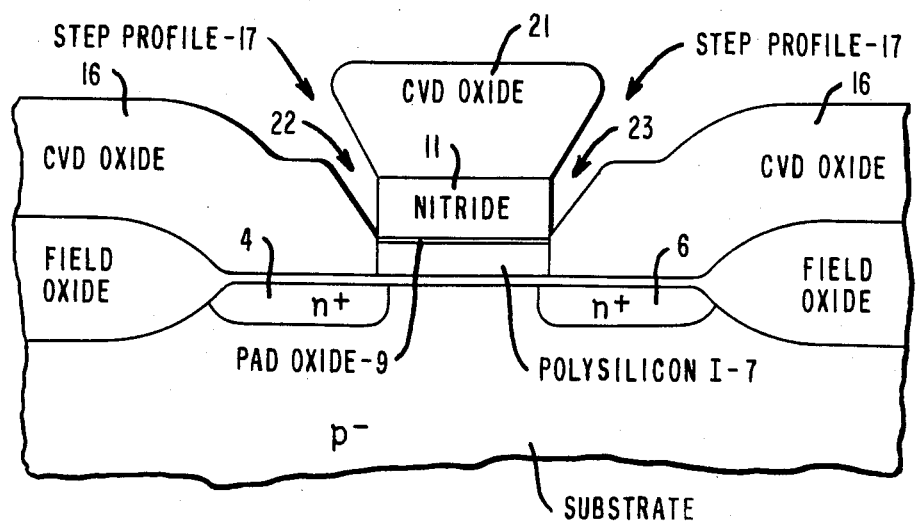
FIG. 3 is a schematic cross-section following the selective etch of the stressed CVD oxide.
Figure 8:
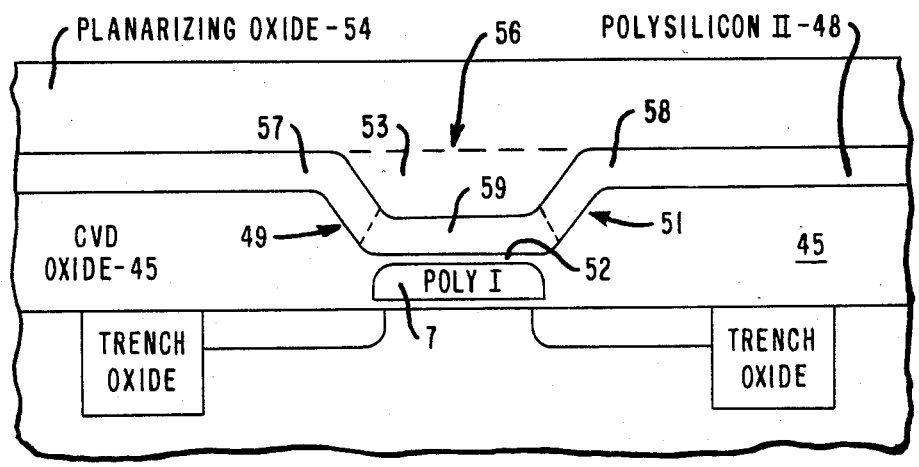
FIG. 8 is a schematic cross-section of the FIG. 4 structure fabricated with trench oxide isolation.

In progressing to the cross-sectional structure depicted in FIG. 8, fabrication proceeds in the manner formerly described with a reference to FIGS. 3, 4 and 5. Following that procedure, polysilicon I level gate electrode 7 is processed to form an upper FET gate oxide 52 and in succession covered by a conformally deposited polysilicon II layer 48 as shown in FIG. 8. Note that the contour of polysilicon II layer 48 follows CVD oxide 45 into the recess defined by sloping walls 49 and 51. Sloping walls 49 and 51 are attributable to the combined effects of lift-off nitride 11 and the selectivity in the etch of stressed CVD oxide regions 43 and 44 over unstressed CVD oxide 45. Following the formation of the polysilicon layer 48, the substrate is processed in the manner previously described to form a planarizing oxide layer 54, and any necessary overlying layers to allow the planar removal of planarizing oxide 54 to the level 56 defined by the upper surface of polysilicon layer 48, so as to retain in self-alignment with polysilicon I gate electrode 7 a planarizing oxide region 53. Oxide region 53 again serves as a mask during subsequent diffusion or implantation of dopants into the exposed regions of polysilicon II layer 48, in such a way that following the diffusion or implant polysilicon II layer 48 is heavily doped and conductive in the lateral, source/drain and interconnect regions 57 and 58, while remaining substantially intrinsic, undoped, in the self-aligned upper field effect transistor channel region 59. The structure is then annealed or subjected to laser recrystallization as described previously.

Figure 9:
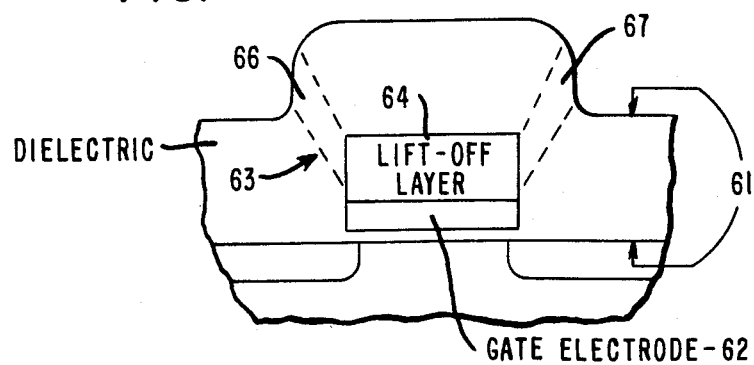
FIG. 9 is a schematic representation of the important structural elements central to the practice of the present invention.

The schematically depicted cross section in FIG. 9 directs attention to the fabrication parameters which have paramount importance in the practice of the present invention. First, the thickness 61 of the first dielectric, heretofore oxide, must be materially greater than the thickness of gate electrode 62 to ensure a recess slope 63 which is both steep and of sufficient depth to allow the subsequent formation of an upper mask in the recess formed. Secondly, the thickness 61 of the dielectric in relation to the thickness of lift-off layer 64 must be suitable to create laterally located stressed regions 66 and 67 in the dielectric, which regions are characterized by an etching selectivity. Lastly, the composition of the lift-off layer 64 must be suitable for a selective removal through openings etched in regions 66 and 67 of the dielectric layer to allow the selective removal of lift-off layer 64 in the presence of the dielectric and the gate electrode 62. Of course, it is also important that during the subsequent processing a self-aligned masking region is formed by planarization, and that the mask material retained in the recess (such as oxide 53 in FIG. 8) is suitable in thickness and composition to form a dopant mask during the implant or diffusion operation used to form the source/drain regions of the upper field effect transistor.

We claim:

1. A process for fabricating in an active region of a substrate an aligned, three-dimensionally integrated circuit structure having two channel regions responsive to a common gate electrode, comprising the steps of:
   forming in the active region of a semiconductor substrate over a first channel defined between first source/drain regions a relatively thick lift-off material layer coextensive with an underlining gate electrode layer, together forming sidewalls at the channel ends;
   forming a first dielectrical layer, over the integrated circuit structure, characterized by the presence of an accentuated etchability of the first dielectric layer in the regions covering the sidewalls of the lift-off material layer;
   selectively etching first dielectric layer material covering the sidewalls of the lift-off material layer to expose the lift-off material;
   selectively removing the lift-off material and first dielectric formed thereover to form a recess in correspondence with the gate electrode layer;
   forming a conformal layer of a semiconductor material over the structure to retain a recess in correspondence with the gate electrode layer;
   forming a region of dopant masking material in the recess in correspondence with the gate electrode layer; and
   doping the semiconductor material in the presence of the region of dopant masking material to form in the semiconductor material layer a second channel under the dopant masking region and second source/drain regions outside the dopant masking region.

2. The process recited in claim 1, wherein the first dielectric layer formed over the integrated circuit structure is silicon dioxide with stressed sidewall regions.

3. The process recited in claim 2, wherein the first dielectric layer is materially thicker than the gate electrode layer.

4. The process recited in claim 3, wherein the relatively thick lift-off material layer is materially thicker than the conformal layer of semiconductor material.

5. The process recited in claim 4, wherein a gate dielectric layer is formed over the gate electrode before the step of forming a conformal layer of semiconductor material.

6. The process recited in claim 2, wherein the lift-off material layer is composed of silicon nitride and the gate electrode layer is composed of a polysilicon.

7. The process recited in claim 6, wherein the selective etch of the first dielectric layer material covering the sidewalls utilizes an isotropic etch highly preferential to stressed silicon dioxide over unstressed silicon dioxide.

8. The process recited in claim 6, wherein the conformal layer of semiconductor material is composed of undoped or lightly doped polysilicon.

9. The process recited in claim 8, including after the step forming a conformal layer of a semiconductor material the step of recrystallizing the conformal layer of the semiconductor material layer.

10. The process recited in claim 8, wherein the step of forming a region of dopant masking material in correspondence with the gate electrode layer is comprised of forming a planarizing oxide layer and etching the layer to the plane of the polysilicon.

11. The process recited in claim 8, wherein the conformal layer of semiconductor material is selectively patterned and interconnected by metallization following the doping step.

12. A process for fabricating in an active region of a substrate an aligned, three-dimensionally integrated circuit structure having two channel regions responsive to a common gate electrode, comprising the steps of:
   forming over an active region in the semiconductor substrate a gate dielectric layer covered in succession by a gate electrode layer and a relatively thick lift-off material layer;
   forming a photoresist masking layer corresponding to the pattern of the gate electrode;
   etching the lift-off material layer and the gate electrode layer in the presence of the masking layer to pattern the layers and expose sidewalls thereof;
   doping the substrate active region in the presence of the masking provided by the patterned layers to form self-aligned first source/drain regions;
   forming an oxide layer, over the integrated circuit structure, characterized by the presence of an accentuated etchability of stressed oxide covering the sidewalls of the lift-off material layer;
   selectively etching the stressed oxide covering the sidewalls of the lift-off material to expose the lift-off material;
   selectively removing the lift-off material and oxide formed thereover to form a recess in correspondence with the gate electrode layer;
   forming a gate oxide layer over the gate electrode;
   forming a conformal polysilicon layer over the structure;
   forming a region of dopant masking material in the recess in correspondence with the gate electrode layer; and
   doping the conformal polysilicon layer in the presence of the region of dopant masking material to form in the polysilicon layer a channel under the dope masking region and second source/drain regions outside of the dopant mask.

13. The process recited in claim 12, wherein the oxide layer is materially thicker than the gate electrode layer.

14. The process recited in claim 13, wherein the relatively thick lift-off material layer is materially thicker than the conformal polysilicon layer.

15. The process recited in claim 14, wherein the lift-off material layer is composed of silicon nitride and the gate electrode layer is composed of polysilicon.

16. The process recited in claim 15, wherein the selective etch of the oxide layer covering the sidewalls utilizes an isotropic etch highly preferential to stressed over unstressed oxide.

17. The process recited in claim 16, wherein the step of forming a region of dopant masking material in correspondence with the gate electrode is comprised of forming a planarizing oxide layer and etching the layer to the plane of the polysilicon layer.

18. The process recited in claim 14, including after the step of forming a conformal layer of polysilicon the step of recrystallizing the polysilicon layer.

* * * * *